United States Patent [19]

Davis

[11] Patent Number: 4,539,526
[45] Date of Patent: Sep. 3, 1985

[54] ADAPTIVE SIGNAL WEIGHTING SYSTEM
[75] Inventor: Mark F. Davis, Medford, Mass.
[73] Assignee: dbx, Inc., Newton, Mass.
[21] Appl. No.: 462,372
[22] Filed: Jan. 31, 1983
[51] Int. Cl.³ .......................... H03G 3/20; H03F 3/68
[52] U.S. Cl. .................................. 330/144; 330/285; 330/126
[58] Field of Search ............... 330/126, 144, 278, 285; 333/14

[56] References Cited
U.S. PATENT DOCUMENTS 4,281,295 7/1981 Nishimura et al. ................... 333/14
4,455,535 6/1984 Sugawara ........................... 330/278

Primary Examiner—James B. Mullins
Assistant Examiner—G. Wan
Attorney, Agent, or Firm—Schiller & Pandiscio

[57] ABSTRACT

An adaptive signal weighting system is disclosed for use in transmitting an electrical information signal of a predetermined bandwidth along a signal path. The system can be used to encode or decode the signal. The system comprises filter means disposed in the signal path for varying the gain impressed on the portion of the information signal within a first select spectral region within the preselected bandwidth. The gain is varied in response to and as a function of a first control signal. Means are provided means for generating the first control signal in response to and in accordance with the signal energy of the information signal substantially within at least a part of the first select spectral region. The system also comprises gain control means disposed in the signal path and coupled to the filter means for varying the signal gain impressed on the information signal substantially throughout the predetermined bandwidth, the signal gain varying in response to and as a function of a second control signal; and means for generating the second control signal in response to and as a function of the signal energy of the information signal within at least one other select spectral region of the information signal.

39 Claims, 11 Drawing Figures

ADAPTIVE SIGNAL WEIGHTING SYSTEM

The present invention relates generally to signal conditioning systems and more particularly to adaptive signal transmission systems utilizing compansion techniques.

Although many audio and video components now available contribute negligible noise and distortion, a few components, notably FM broadcast, reception channels, digital channels, and audio and video tapes and playback channels, can contribute very noticeable noise when used as part of an audio or video reproduction system. This problem can arise, for example, because any recording or transmitting channel has a limited dynamic range.

More specifically, every recording or transmitting channel exhibits a maximum signal level and a minimum noise level between which one can transmit a signal without excessive contamination in the form of distortion or noise. The dynamic width or window of the channel is typically limited with the channel width varying as a function of frequency. The channel medium may take various forms such as magnetic tape, as in the case of audio and video recordings, or space, as is the case with radio and TV broadcasting. Thus, for example, where the width of a channel such as that provided in a typical audio cassette tape is limited to 55 dB within the spectral region where most program information resides and one wishes to record a 100 dB dynamic range program, a typical commercially available single band compansion system can be used to compress the program information signal when recording it on the tape so that a substantial portion of the signal information is recorded below the maximum signal level of the channel and above the minimum noise level of the channel. This can be done for example, by compressing the signal at a 2:1 compression ratio for the entire spectrum. The compressed program is then expanded in a complementary manner at a 1:2 expansion ratio to restore the signal to its original form without a sustantial loss of dynamic range.

The basic approach of compressing the entire information or program signal with a fixed compression ratio within a single band, however, has some disadvantages. For example, where the program signal is in the audio range, when the compressed signal is expanded upon playback and the sonic signals are produced by audio speakers in response to the expanded program signal, the human ear distinguishes these sonic signals on the basis of both amplitude and frequency. If one plots the dynamic width of a recording channel such as an audio cassette tape, as a function of frequency, one will find that the top curve, representative of the maximum signal recordable on the tape, is substantially flat through the middle frequencies while dropping off at the low end of the spectrum (e.g., beginning at about 50 Hz and falling off at lower frequencies) and dramatically dropping off at the high end of the spectrum (e.g., beginning at about 2 KHz). Further, for typical audio tapes, the noise level (the bottom curve) begins to increase at some relatively high frequency. The conclusion of this spectral analysis is that the window (i.e., the difference between the minimum noise level and the maximum signal level) will differ throughout the spectrum (i.e., is frequency dependent). For example, for typical audio tapes, the channel provides a dynamic range window of 55 dB at 400 Hz while only 25 dB at 15 KHz. Thus, when recording a 100 dB range program signal on the tape at a compression ratio of 2:1 the information at 400 Hz can be recorded because of the 55 dB window at that frequency. However, a substantial amount of information would be lost in the high frequency range at 15 KHz since only a 25 dB window is provided. Audio tape cassette single band systems which utilize a fixed 2:1 compression ratio through the entire spectrum therefore sometimes chop off strong high frequencies resulting in dull sound upon playback, while low signals at high frequencies tend to fall below the noise floor resulting in a phenomenon known as "breathing". Various, approaches have been proposed to overcome these disadvantages.

One commercially-available system known as the Dolby B system operates on the assumption that most information (i.e., signal energy) is in the 20 Hz–800 Hz range of the audio signal, and that information tends to fall off above 800 HZ. Accordingly, this system provides a high frequency boost between 400 Hz and 1200 Hz. The amount of boost varies depending on the level of the input signal with a maximum 10 dB boost typically being provided. Thus, during compression if the maximum signal level transmitted or recorded at high frequencies is minus 10 dB, with maximum boost the level is brought down to minus 20 dB. At high frequencies, however, the high frequency portion of the program signal can exceed the maximum signal level of the recording channel of the tape so that high frequency saturation occurs resulting in dull listening sound upon playback. In order to remedy this problem it is necessary to bring more of the high frequency information below the maximum signal level so that more of the information can be recorded. However, this results in a sacrifice in available dynamic range in the midrange of frequencies to gain an equivalent amount in the high frequency range. Thus, the Dolby B system provides only a dynamic range increase of 10 dB at high frequencies while providing little or no change in dynamic range at low frequencies.

In U.S. Pat. Nos. 4,101,849 and 4,136,314 issued to David E. Blackmer and C. Rene Jaegar, respectively on July 18, 1978 and Jan. 23, 1979 (both patents being assigned to the present assignee), systems are described for encoding and decoding a signal during transmission or recording. During encoding, the program signal is compressed with high frequency preemphasis. During decoding, the signal is expanded and deemphasized in a complementary manner. As described in these patents and as used herein, the term "preemphasis" means the alteration of the magnitude of select frequency components of an electrical signal with respect to the magnitude of others, to reduce noise in subsequent points in the system. The alteration can be in a negative sense wherein the magnitude of the select frequency components are suppressed, or the alteration can be in a positive sense wherein the magnitude of the select frequency components is enhanced. Similarly, the term "deemphasis" means the alteration of the select frequency components of the encoded signal in either a negative or positive sense in a complementary manner in which the original signal is altered. In the patented system, a control signal, as a function of the ratio of the energy in the high and low frequency portions of the program signal, is utilized to control the amount of signal preemphasis of preferably the high frequency portion of the program signal during compression. In a similar, complementary manner the information signal is deemphasized by a similar control signal during expansion upon reception or playback of the program signal.

The use of a control signal derived as a function of the ratio of the signal energy in the high and low frequency portions of the program signal has the advantage that preemphasis is controlled independently of the level setting requirements between the encoding and decoding systems. However, such a system does not always make the most efficient use of a transmission or recording channel whose dynamic range is frequency dependent. For example, a low level program signal having most of its energy in the high frequency region will be selected as a program signal close to saturation, since the ratio of high to low signal energy will be large and thus the control signal generated will be of a type providing greater negative preemphasis than is necessary. Further, the use of an adaptive weighting filter, such as shown in U.S. Pat. Nos. 4,101,849 and 4,136,314, does not necessarily match the frequency response of the recording or transmission channel, especially where the maximum signal level decreases and the noise floor increases with increasing frequency in the high frequency region.

It is a general object of the present invention to substantially reduce or overcome the above-noted disadvantages of the prior art.

More specifically, it is an object of the present invention to provide improved signal encoding and decoding systems.

Another object of the present invention is to make more efficient use of a channel having a frequency dependent variable window when recording or transmitting in that channel.

And another object of the present invention is to approximate as closely as possible the peak signal level recorded or transmitted in a frequency-dependent variable window of a recording or transmission channel with that of the maximum signal level of the recording or transmitting channel so that it can be recorded or transmitted just below the maximum signal level curve.

Yet another object of the present invention is to keep low signal levels recorded or transmitted above the noise floor of the channel.

Still another object of the present invention is to provide ducking of the low frequency portions at peak signal levels so as to closely match the maximum signal levels of the channel.

And yet another object of the present invention is to provide ducking of the high frequency portions at peak signal levels so as to closely match the maximum signal level of the channel and to provide boosting of the high frequency portion of low signal levels so as to more closely match the minimum noise level of the channel.

These and other objects of the present invention are provided by an improved adaptive signal weighting system for use in transmitting an electrical signal of a predetermined bandwidth along a signal path. The system comprises filter means disposed in the signal path for varying the gain impressed on the portion of the electrical signal within a first select spectral region within the preselected bandwidth. This gain varies in response to and as a function of a first control signal. Means are provided for generating the first control signal in response to and in accordance with the signal energy of the electrical signal substantially within at least a part of the first select spectral region. The system also includes gain control means disposed in the signal path and coupled to the filter means for varying the signal gain impressed on said electrical signal substantially throughout the predetermined bandwidth, the signal gain varying in response to and as a function of a second control signal, and means for generating the second control signal in response to the signal energy of the electrical signal substantially within at least a part of the select spectral region.

Other objects of the invention will in part be obvious and will in part appear hereinafter. The invention accordingly comprises the apparatus possessing the construction, combination of elements and arrangement of parts which are exemplified in the following detailed disclosure, and the scope of the application of which will be indicated in the appended claims.

For a fuller understanding of the nature and objects of the present invention, reference should be had to the following detailed description taken in connection with the accompanying drawings wherein.

Figure 1:
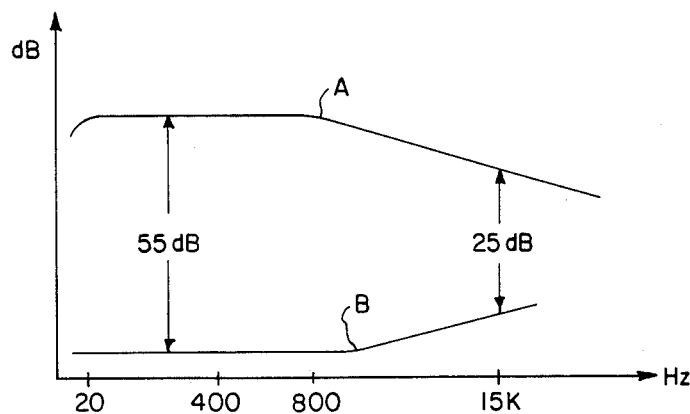
FIG. 1 is a simplified graphical representation of the frequency response of a typical cassette tape recording channel (one-third octave, constant-Q analysis)

Referring to the drawings, wherein like numerals refer to similar parts, FIG. 1 illustrates why a typical recording or transmitting channel has limited dynamic range. More particularly, FIG. 1 illustrates, by way of example, the frequency response of an audio cassette tape. As in any recording or transmitting channel, the latter is defined by a maximum signal level curve A, which defines the peak signal level at each frequency. If the amplitude of any portion of the program signal exceeds the maximum signal level, saturation occurs and the portion will be "chopped off" i.e., distorted. As shown, cassette tapes typically have a maximum signal level curves which fall at low frequencies (below about 20 Hz to 50 Hz) and gradually decline at high frequencies (beginning at about 3 KHz). Curve B defines the noise spectrum level of a typical cassette tape, which usually gradually increases in strength beginning at 400 Hz and increases with frequency. Any signal levels of the program signal falling below curve B will fall below the noise "floor" and therefore will be lost on playback. Thus, if one wishes to preserve the integrity of the original signal, the dynamic levels of the program signal transmitted or recorded in the channel must be within the window provided between the maximum signal level and the noise spectrum, or must be modified prior to recordation or transmission so as to fall within the window. It should be noted that the window actually decreases at higher frequencies. For typical cassette tapes for example, a 25 dB window is provided at 15 KHz, less than half that of the 55 dB window at 400 Hz.

The basic prior art approach for processing a signal prior to transmitting or recording the signal in a dynamic range limited medium, such as a cassette tape, is to "compress" the signal. This approach essentially reduces higher levels of the program signal so that it will fall below the maximum signal level, and enhances low levels of the program signal so that it will lie above the noise spectrum level. When playback is desired, the compressed program signal in the medium is expanded, a process which is the complement of "compression" so as to restore the original signal to its original dynamic range, thereby preserving the integrity of the original signal. Thus, if one wished to record a 100 dB dynamic range program, it would be necessary to severely compress the program signal when recording it on a cassette tape of the type exhibiting the characteristics of FIG. 1. If a single band 2:1 compression ratio is utilized, the signal can be preserved at midfrequencies (where the 100 dB range of the program is reduced to 50 dB when compressed (within the 55 dB window), but a substantial amount of information is lost in the high frequency range (since only a 25 dB window is provided within this range). When the signal is expanded during playback, the loss of high frequency information results in a rather dull sound, while low level signals at high frequencies tend to fall below the noise floor resulting in what is referred to in the art as "breathing". It should be noted that using a single band compressor which provides a compression ratio greater than 2:1, the problem is not overcome because of the large variations in spectral levels encountered in typical music/speech signals. Some sort of spectral compression is needed as well to keep the signal within the channel window.

Accordingly, various approaches have been proposed to preemphasize the signal by modifying the high frequency portion of program signal during compression, and deemphasize in a complementary manner this same high frequency portion of the program signal during expansion when playing back the signal.

Figure 2:
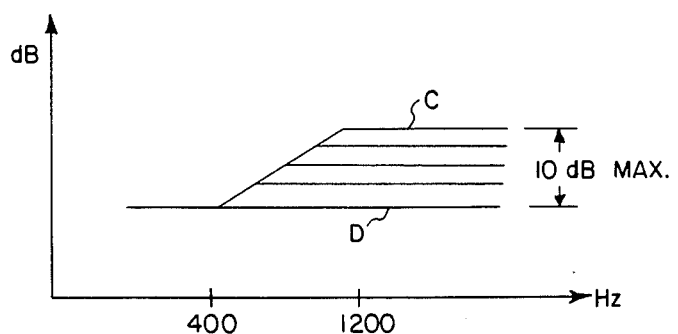
FIG. 2 is a simplified graphical representation of the variable frequency response of a prior art noise reduction system.

One such approach is incorporated in the Dolby B System, commercially available from Dolby Laboratories of San Francisco, and operates on the assumption that most program information tends to lie below approximately 800 Hz and falls off above 800 Hz. Accordingly, the system boosts signal energy between 400 Hz and 1200 Hz, the amount of boost depending on the input signal with a maximum boost of 10 dB. This is illustrated in the simplified graphs of FIG. 2 where the frequency response of the prior art system varies between curve C and D depending upon the level of the input signal, the level at which the maximum curve C levels off is at 1200 Hz.

Figure 3:
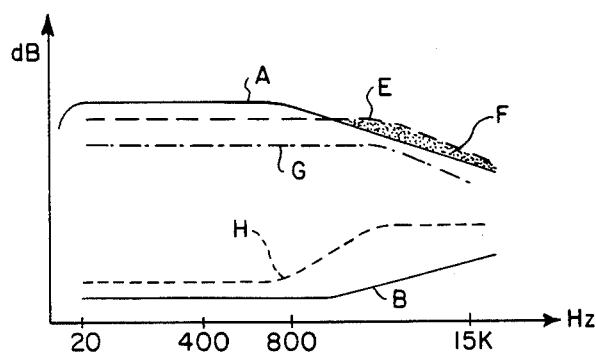
FIG. 3 is a simplified graphical representation of a typical signal recording in the channel depicted in FIG. 1 illustrating two prior art approaches to noise reduction.

However, for a typical program if one plots the peak music spectrum together with the 10 dB maximum boost, it might look something like curve E shown in FIG. 3. As shown, some of the high frequency portion of the program would exceed the maximum signal level of the tape, shown by curve A in FIG. 3, thus resulting in saturation. Those high frequency portions extending above the maximum signal level will be lost as indicated by the shaded area F. Using the Dolby B system it is therefore necessary to reduce the input level such as indicated by curve G so as to avoid saturation and preserve the high frequency portions during the encoding process. It therefore is necessary to reduce the input level 10 dB in order to obtain the 10 dB boost. In other words, it is necessary to sacrifice 10 dB in overall signal level to obtain the 10 dB maximum boost in the high frequency range of the signal. This is an inefficient use of the frequency dependent channel of the cassette tape.

The adaptive signal weighting system shown and described in U.S. Pat. Nos. 4,101,849 and 4,136,314, while providing what is believed to be a better encoding and decoding system, nevertheless, under some circumstances, also does not always make efficient use of the recording or transmission channel. For example, the signal energy of a program signal might resemble the curve H shown in FIG. 3, wherein most of the signal energy is in the higher frequency range, e.g., above 800 Hz. Since the control signal for controlling the amount of preemphasis is preferably derived from a ratio of the signal energy in the higher frequency range with respect to the signal energy in the lower frequency range the control signal will indicate to the system that the program signal levels are close to saturation when in fact it is not. Thus, the high frequency portion of the signal is reduced resulting in the high frequency portion of the signal being closer to the noise floor B.

In accordance with the preferred embodiment of the present invention an improved adaptive signal weighting system is provided by preemphasizing the high frequency signal energy during the encoding process as a function of high frequency signal energy present, and deemphasizing the encoded signal in a complementary manner on reception or during playback.

More specifically, the present invention utilizes complementary tracking filters which alter in a complementary manner the signal energy of the transmitted or recorded signal in the high frequency region. Appropriate means are utilized to sense the signal energy in the high frequency region of the program signal to instruct these filters to dip or duck (suppress) or peak (boost) the high frequency region of the signal during the encoding process and in a complementary fashion during the decoding process.

Figure 4:
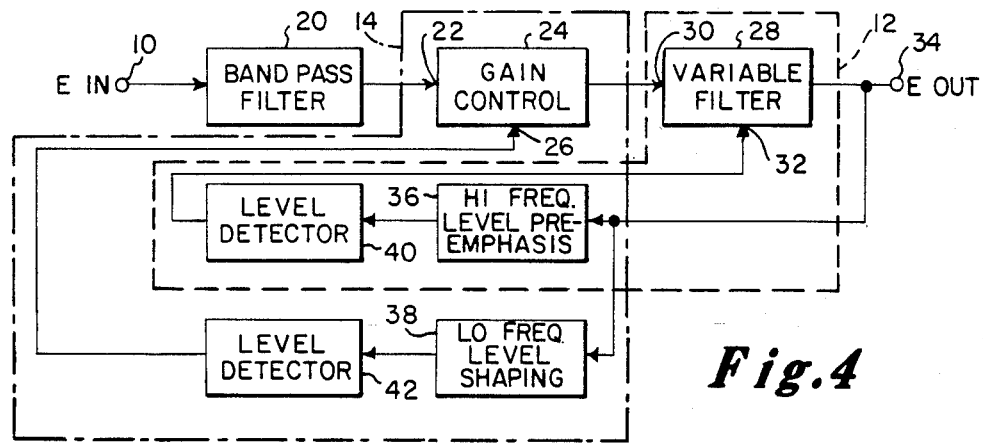
FIG. 4 is a block diagram of the preferred embodiment of the signal encoding system of the present invention.
Figure 5:
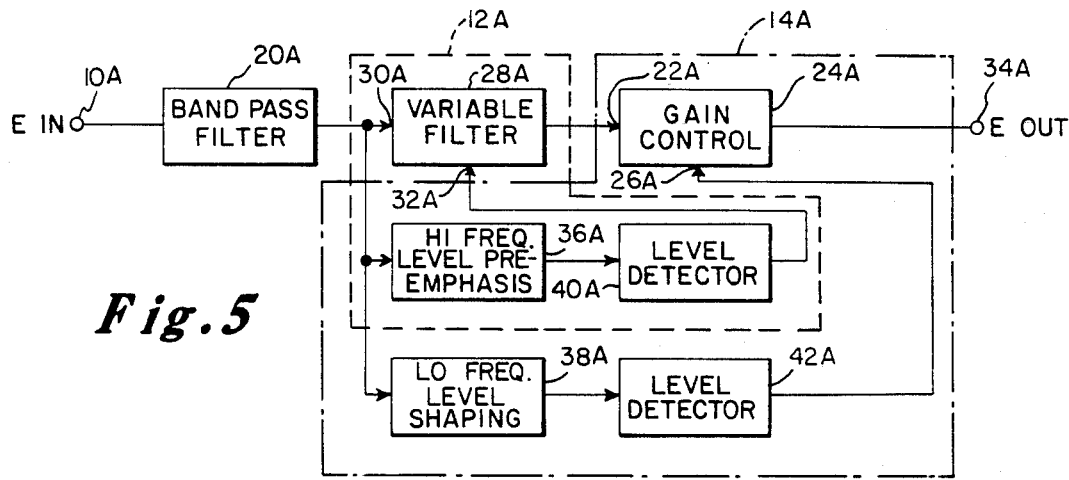
FIG. 5 is a block diagram of the preferred embodiment of the signal decoding system of the present invention.

Referring to the drawings and in particular FIGS. 4 and 5, the respective encoding and decoding systems shown are designed to make better use of the channel over which the program is recorded or transmitted, and in particular, to more closely match the expected peak signal levels of the transmitted or recorded signal with the maximum signal level of a frequency-dependent variable height channel window during the encoding of a program signal in that channel. The encoding system of FIG. 4 includes input terminal 10 for receiving the input program signal Ein which is to be recorded or transmitted. The encoding system generally includes adaptive signal weighting filters, designated at 12 for preferably providing preemphasis of a high frequency region of the program signal Ein. The amount of preemphasis is a function of the signal energy detected in a high frequency part of the program signal. The decoding system shown in FIG. 5 also has a tracking filter 12A for providing a complementary deemphasis of the encoded signal Ei applied to the input terminal 10A during reception or playback.

The filters 12 and 12A are preferably used with gain control modules for respectively compressing and expanding in a complementary manner the program and encoded signals during the encoding and decoding process. The compression and expansion are each accomplished as a function of the signal energy of at least one spectral part of the transmitted signal. Accordingly, filter 12 can be used with a compressor, generally indicated at 14, to form a compressor system (see FIG. 4) for encoding the program signal Ein, prior to transmission or recording, and preemphasizing the signal energy in at least one spectral region of the program signal. Similarly, the filter 12A is used with an expander, generally indicated at 14A to form an expansion system (see FIG. 5) for decoding and deemphasizing the encoded signal Ei, applied to the system input terminal 10A upon reception or playback.

The system of FIG. 4 comprises an input buffer and band pass filter 20 for limiting the bandwidth of the program signal transmitted through the encoding system. Generally, the bandwidth is selected so that all of the program information will be transmitted through the encoding system. The output of filter 20 is applied to the input terminal 22 of the gain control module 24. The latter is provided with a control terminal 26 connected to receive a gain control signal, as described hereinafter. Generally, the module is designed to compress the entire spectral region of the signal transmitted through filter 20 in response to and as a function of the control signal applied to control terminal 26. The output of module 24 is applied to input terminal 30 of variable filter 28. Generally, filter 28 is designed in accordance with the present invention to preemphasize the high frequency spectral region of the compressed signal transmitted from the output of module 24. The amount of preemphasis is in response to and as a function of the spectral energy contained in a high frequency portion of the signal. The output of filter 28 is coupled to the system output terminal 34 for providing the encoded signal Eout, and is coupled to the feedback circuit of the system.

The feedback circuit provides the two control signals to the gain control module 24 and variable filter 28. The feedback circuit preferably detects the amount of signal energy in two spectral portions of the transmitted signals. The control signal applied to the control terminal 32 of filter 28 is preferably derived from the spectral energy contained in the detected high frequency spectral portion of the signal. More particularly, the output of filter 28 is simultaneously applied to the input of a high frequency level preemphasis filter 36 and to the input of a low frequency level shaping filter 38. Filters 36 and 38 are preferably each bandpass filters designed to pass the detected signal energy in two spectral regions. Preferably, where the invention is used for processing audio signals, the high frequency level preemphasis filter 36 is a band pass filter designed to pass most of the signal energy between about 2 KHz and 10 KHz, where most of the channel noise resides, while the low frequency level shaping filter is a bandpass filter designed to pass most of the signal energy between about 50 Hz and 5 KHz, where most of the program information resides. The filters 36 and 38, however, can be designed to transmit other bandpass regions. For example, filters 36 and 38 can have frequency characteristic curves which are substantially the inverse of one another so that signal energy within the band defined by filter 20 and not transmitted through one of the filters 36 and 38 will be transmitted through the other one of the filters 36 and 38.

The output of filters 36 and 38 are coupled to the input of respective level detectors 40 and 42. The latter each provide a DC output signal as a function of the signal energy sensed at its input. The DC output signal can be, for example, a function of the RMS, average or peak values of the signal energy instantaneously sensed, with RMS detection techniques being preferred. Thus, the output of each level detector 40 and 42 is a measure of the level or amplitude of the signal energy of the transmitted signal within the frequency range of the respective filter providing the input signal. Accordingly, since filter 36 passes only relatively high frequency energy, the output of level detector 40 can be used to instruct or control the variable filter 28 by connecting the output of detector 40 to control terminal 32 of filter 28.

The output of level detector 42 is connected to the control terminal 26 of the gain control module 24, so as to provide compression of substantially the entire bandwidth of the signal transmitted by filter 20 based on the signal energy within the low frequency band detected by low frequency filter 38.

The decoding system of FIG. 5 generally includes the same elements as the encoding system of FIG. 4, modified and rearranged to the extent necessary so as to provide a frequency weighting function substantially the complement of the weighting function of the encoding system of FIG. 4. Thus, the system input terminal 10A is adapted to receive the encoded signal Ei and is connected to the input terminal of input buffer and bandpass filter 20A. The latter is substantially identical to filter 20 of FIG. 4. The output of filter 20A is connected to input terminal 30A of variable filter 28A. The output of filter 28A is connected to the input terminal 22A of gain control module 24A, while the latter has its output coupled to the output terminal 34A of the decoding system for providing the decoded signal Eo. The control signals applied to the control terminals 32A and 26A are provided by a feed forward circuit substantially identical to the feedback circuit of the encoding system of FIG. 4. The feedforward circuit is formed by connecting the output of filter 20A to the input of each of the filters 36A and 38A. The latter filters are substantially identical in their transmission characteristics to the corresponding filters 36 and 38 of the encoder. The outputs of filters 36A and 38A are respectively connected to the inputs of detectors 40A and 42A. The output of detector 40A is coupled to the control terminal 32A of variable filter 28A. The output of detector 40A thus provides the control signal for controlling the gain impressed on the high frequency portion of the signal transmitted through filter 28A so as to provide the desired deemphasis during the decoding process. This deemphasis is the complement of the amount of preemphasis during the encoding process. The output of detector 42A is coupled to the control terminal 26A of gain control module 24A. The output of the detector 42A therefore provides the control signal for controlling the signal gain impressed on the deemphasized signal to provide the complementary expansion during the decoding process.

Figure 6:
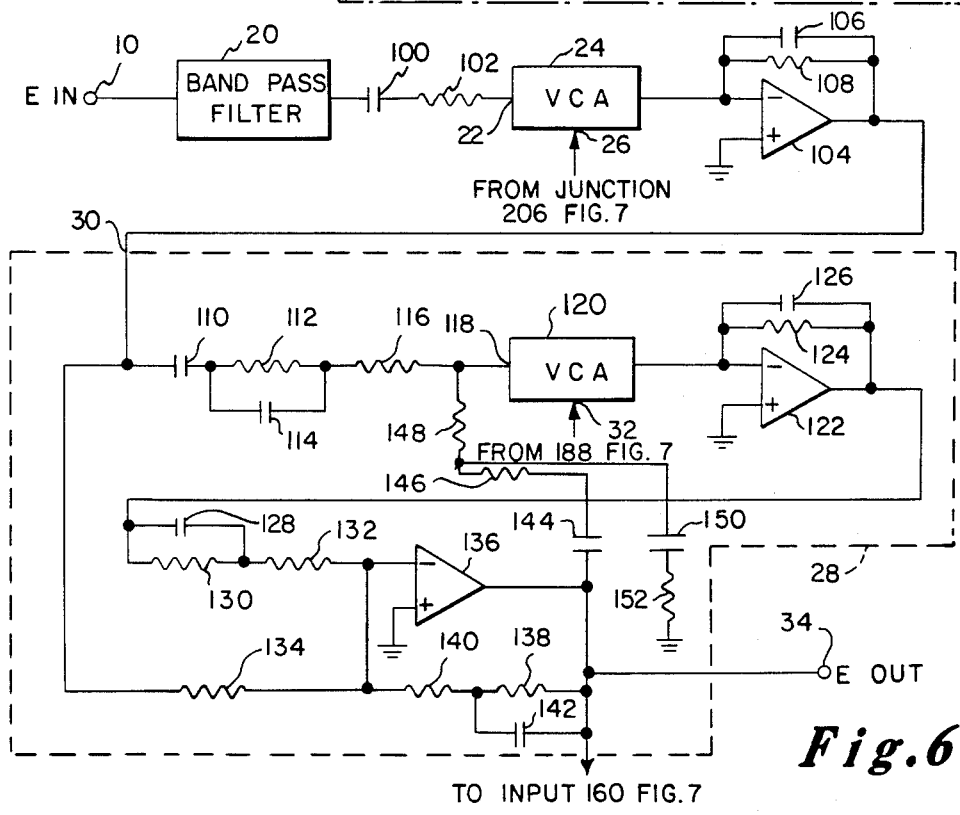
FIG. 6 is a partial block and partial schematic diagram of a portion of the preferred embodiment of the encoding system of the present invention.
Figure 8:
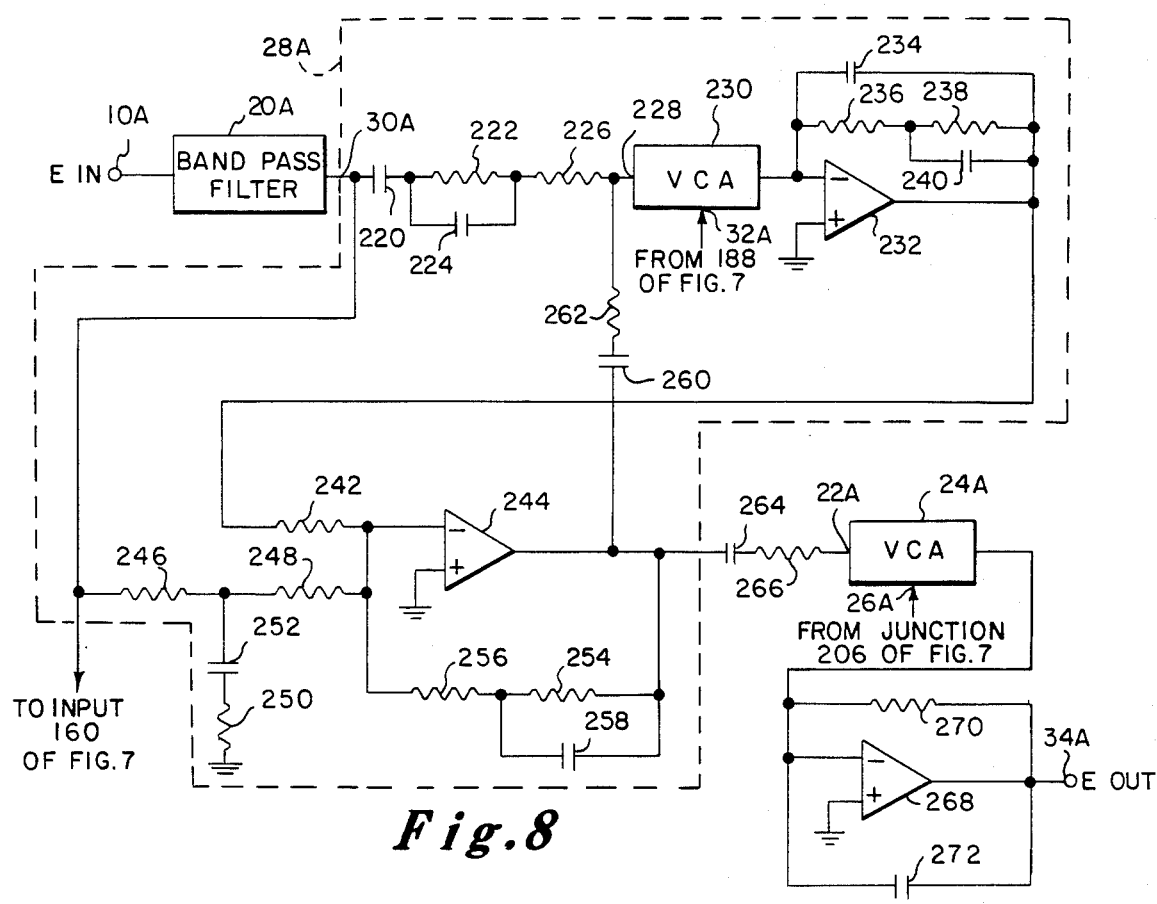
FIG. 8 is a partial block and partial schematic diagram of a portion of the preferred embodiment of the decoding system of the present invention.
Figure 7:
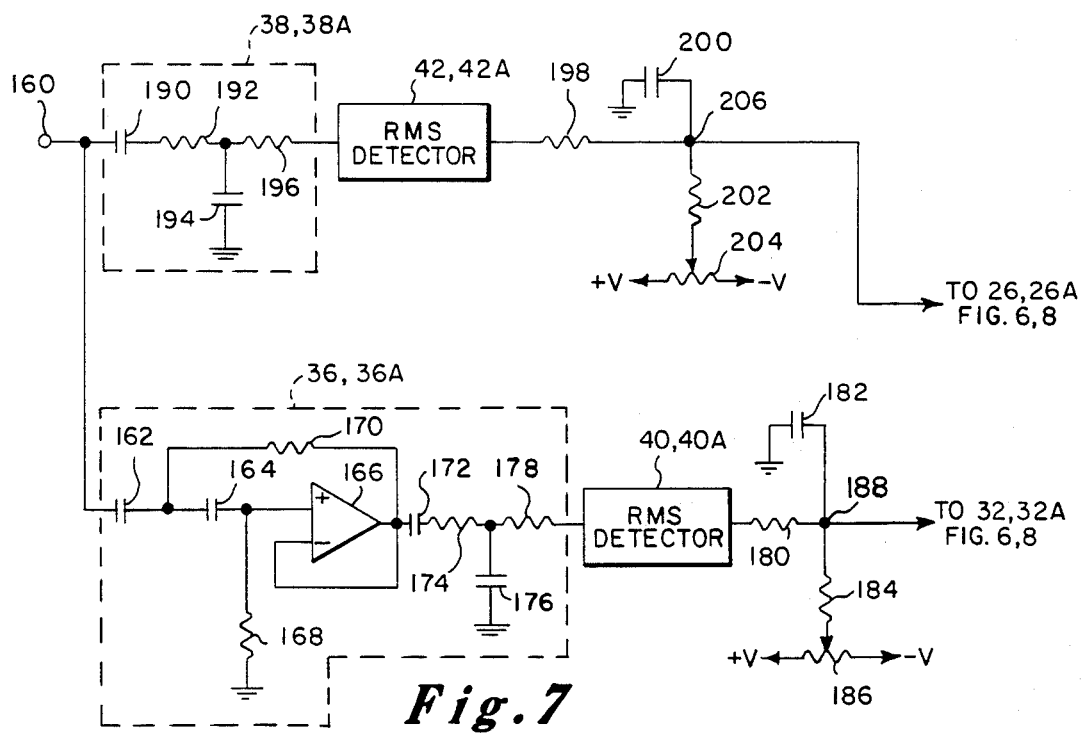
FIG. 7 is a partial block and partial schematic diagram of the remaining portion of each of the encoding or decoding systems of FIGS. 6 and 8.

The preferred embodiment of the encoder and decoder systems of FIGS. 4 and 5 are described in greater detail with respect to FIGS. 6-8. More specifically, referring to FIG. 6 system input terminal 10 is connected to bandpass filter 20 which limits the bandwidth of the program signal applied to terminal 10 and functions to buffer system input terminal 10 from the remaining portion of the system. Where the program signal is an audio signal bandpass filter 20 is preferably designed to pass all signal energy between about 20 Hz and 20 Khz. One such filter is described and shown in U.S. Pat. Nos. 4,101,849 and 4,136,314, although other such filters are well-known in the art. The output of filter 20 is connected to capacitor 100, which in turn is connected in series with resistor 102. The latter is connected to input terminal 22 of gain control module 24. Generally, module 24 compresses a signal applied at its input by a variable gain as a function of the control signal applied to control terminal 26 from junction 206, shown in FIG. 7. Module 24 may be any type of gain control circuit for providing compression and is preferably a voltage control amplifier (VCA) of the type described in U.S. Pat. No. 3,789,143. It should be appreciated, however, that other circuits are known for providing variable gain in response to a command or control signal. For example, one may use a light responsive resistance or a field effect transistor or an element of a voltage divider or known analog multipliers using balanced semiconductor parts, or the like. The preferred voltage control amplifier serves to control the gain impressed on the input signal in proportion to (when expressed in decibels) the level of the control signal present at junction 206. The VCA thus provides compression in which the output to input levels, in decibels, are related by a substantially constant ratio which is lower than unity. In the preferred embodiment this VCA is set to provide a 2:1 compression ratio. The output of module 24 is connected to the inverting input of amplifier 104, the latter having its noninverting input connected to system ground. The output of amplifier 104 is connected through a feedback capacitor 106 and through a feedback resistor 108 to the inverting input of the amplifier. The output of amplifier 104 is also connected to the input terminal 30 of the variable filter 28.

Preferably, variable filter 28 has its input terminal 30 connected to capacitor 110, which in turn is connected to resistor 112 and to capacitor 114. Resistor 112 and capacitor 114 are connected together and to resistor 116. The latter, in turn, is connected to the input terminal 118 of gain control module 120. Gain module 120 is preferably identical to the module 24 and therefore preferably is a voltage control amplifier of the type described in U.S. Pat. No. 3,789,143. Thus, module 120 receives its control signal at its control signal terminal 32 from junction 188 shown in FIG. 7 and described in greater detail hereinafter. Module 120 is preferably set to provide the same compression ratio as module 24, i.e. a preferred compression ratio of 2:1. However, as will be more evident hereinafter, the signal input at input terminal 118 will contain substantially only signal energy in a high frequency portion of the input signal. Preferably, this high frequency portion is signal energy above about 2000 Hz, although this can vary. The output of module 120 is connected to the inverting input of an amplifier 122, the latter having its noninverting input connected to system ground. Amplifier 122 has its output connected through a feedback resistor 124 and through a capacitor 126 to its inverting input. Amplifier 122 has its output also connected to the capacitor 128 and the resistor 130. Capacitor 128 and resistor 130 are in turn connected together and to resistor 132. The latter, in turn, is connected through resistor 134 to the input terminal 30 of the filter. Resistor 132 is also connected to the inverting input of amplifier 136, which in turn has its noninverting input connected to system ground. The output of amplifier 136 is connected to its inverting input through the series connected resistors 138 and 140. A feedback capacitor 142 is connected between the output of amplifier 136 and the junction formed by resistors 138 and 140. The output of amplifier 136 is also connected through capacitor 144 to resistor 146. The latter, in turn, is connected through resistor 148 to the junction between resistor 116 and input terminal 118 of module 120. The junction between resistors 146 and 148 is connected to capacitor 150, which in turn is connected through resistor 152 to system ground. The output of amplifier 136 is connected directly to system output terminal 34 for providing the encoded signal Eout. This output terminal is connected to the input terminal 160 of the feedback detection path of the decoding system, shown in FIG. 7.

In FIG. 7 input terminal 160 is connected to the input of high frequency level preemphasis filter 36 and to the input of the low frequency level shaping filter 38. More particularly, terminal 160 is connected to capacitor 162 of filter 36. Capacitor 162 in turn is connected to capacitor 164 which, in turn, is connected to the noninverting input of amplifier 166 and through resistor 168 to system ground. The output of amplifier 166 is connected directly to its inverting input and through feedback resistor 170 to the junction provided between capacitors 162 and 164. The output of amplifier 166 is also connected through capacitor 172 to resistor 174. The latter, in turn, is connected to system ground through capacitor 176 and through resistor 178 to the input of level detector 40. Detector 40 is preferably an RMS level detector of the type described in U.S. Pat. No. 3,789,143. More particularly, the preferred RMS detector provides a DC output logarithmically related to the instantaneous RMS value of the signal provided at its input by the output of filter 36. It should be appreciated that while an RMS level detector is preferred, other detectors may be used, such as an averaging detector or a peak detector. The output of detector 40 is connected to resistor 180, which in turn is connected through capacitor 182 to system ground. Resistor 180 is also connected through resistor 184 to the wiper arm of potentiometer 186, the latter being appropriately connected to positive and negative potential sources. The junction 188 formed by resistor 180, capacitor 182, and resistor 184 is connected to control terminal 32 of module 120 of the variable filter 28 shown in FIG. 6.

The terminal 160 is also connected to the low frequency shaping filter 38 by connecting the terminal 160 to capacitor 190, which in turn is connected to resistor 192. The latter is connected through capacitor 194 to system ground and through resistor 196 to the input of level detector 42. Detector 42 preferably although not necessarily is identical to detector 40 and therefore preferably is an RMS detector of the type described in U.S. Pat. No. 3,789,143, although the time constants of detectors 40 and 42 are set differently from one another so that detector 40 (provided with a faster time constant) responds more quickly than detector 42 since high frequency signal energy moves more quickly than low frequency signal energy. The output of detector 42 is connected to resistor 198, which in turn is connected through capacitor 200 to system ground and through resistor 202 to the wiper arm of potentiometer 204. The latter is appropriately biased by positive and negative voltages as well known in the art. The junction 206 formed by resistor 198, capacitor 200, and resistor 202 is connected to control terminal 26 of module 24 in FIG. 6. It should be appreciated that the relative signal levels of the outputs of detectors 40 and 42 can be accurately set by setting the adjustments of potentiometers 186 and 204 prior to the use of the system.

The preferred decoding system is shown in FIG. 8 in combination with the detection circuit of FIG. 7. More particularly, the input terminal 10A receives the decoded signal Ei. Terminal 10A is connected to the input of the input buffer and bandpass filter 20A, the latter being identical to filter 20 of the encoding system and shown in FIG. 6. The output of bandpass filter 20A is connected to input 30A of variable filter 28A. Since the same detection path is used in the decoding system as in the encoding system but is used as a feedforward circuit, the output of 20A is connected to the input terminal 160 of the detection path of FIG. 7. The input terminal 30A of filter 28A is connected to a capacitor 220. Capacitor 220, in turn, is connected through each of the parallel connected resistor 222 and capacitor 224 to the resistor 226. Resistor 226 in turn is connected to the input 228 of module 230. The latter is identical to modules 24 and 120 of the encoding system and therefore preferably is a voltage control amplifier of the type described in U.S. Pat. No. 3,789,143, except that the amplifier is set to provide expansion by an expansion factor which is the exact complement of the compression factor provided by module 120 of the compressor system of FIGS. 6 and 7. Thus, in the preferred system the module 230 is set to provide an expansion ratio of 1:2. Module 230 has its control terminal 32A connected to receive the output from junction 188 of the feedforward detection path circuit identical to the circuit shown in FIG. 7. The output of module 230 is connected to the inverting input of amplifier 232, the latter having its noninverting input connected to system ground. The output of amplifier 232 is connected through a feedback capacitor 234 to its inverting input, through the series connected resistors 236 and 238 to its inverting input and through capacitor 240 to the junction formed by resistors 236 and 238. The output of amplifier 232 is also connected through resistor 242 to the inverting input of amplifier 244, the latter having its noninverting input connected to system ground. The inverting input of amplifier 244 is also coupled to the output of filter 20A though a low pass filter section comprising resistors 246, 248, and 250 and capacitor 252. More particularly, the output of filter 20A is connected through resistor 246 to the capacitor 252, which in turn is connected through 250 to system ground. The junction formed between resistor 246 and capacitor 252 is connected through resistor 248 to the inverting input of amplifier 244. The output of amplifier 244 is connected through the series connected resistors 254 and 256 to the inverting input of the amplifier. The output of the amplifier 244 is also connected through capacitor 258 to the junction formed between resistors 254 and 256. The output of amplifier 244 is also connected through capacitor 260 to resistor 262, which in turn is connected to the junction between resistor 226 and the input terminal 228 of module 230. The junction formed by the output of amplifier 244 and the capacitor 260 forms the output of the variable filter which is connected to capacitor 264. The latter, in turn, is connected to resistor 266. Resistor 266 is connected to input terminal 22A of the module 24A. Module 24A is identical to the gain control module 230 and thus preferably is a voltage control amplifier of the type described in U.S. Pat. No. 3,789,143. Module 24A is set to provide signal expansion in a complementary fashion to the signal compression provided by module 24 in the encoding system and preferably at the same expansion ratio as provided by module 230, an expansion ratio of 1:2. Module 24A has its control terminal 26A connected to junction 206 of the detection path for the decoding system shown in FIG. 7. The output of module 24A is connected to the inverting input of amplifier 268, the latter having its noninverting input connected to system ground. The output of amplifier 268 is connected through feedback resistor 270 to its inverting input and through capacitor 272 to its inverting input. The output of amplifier 268 forms the output of the decoding system at terminal 34A for providing the decoded signal Eo.

Now turning to a description of the operation of the encoding and decoding systems, a program signal Ein is applied to the input terminal 10 when it is desired to either transmit or record the signal through a dynamically limited frequency dependent channel window such as shown in FIG. 1. With gain control module 24 set to provide signal compression at a ratio of 2:1 and variable filter 28 providing preemphasis at a compression ratio of 2:1, the system can be used to record a 100 dB program signal on a cassette tape having a frequency response similar to the one shown in FIG. 1 without distortion. The input signal Ein is first filtered by filter 20 and then applied to the input terminal 22 of the gain control module 24. The entire signal energy within the bandwidth of interest is passed by filter 20 and is compressed by module 24 in response to the control signal applied from junction 206 of FIG. 7. The compression occurs at a compression ratio of 2:1 with the gain impressed on the signal by module 24 varying in accordance with the level provided at control terminal 26 from level detector 42. The compressed signal is then applied through the amplifier stage provided by amplifier 104 and applied to the variable control filter 28. The latter provides an amount of preemphasis as a function of the signal energy detected by the high frequency level preemphasis filter 36 of the detection path of FIG. 7. The amount of preemphasis will vary in such a way that when the detected high frequency energy is low the module will actually boost this energy above the noise floor of the channel. On the other hand, should the detected high frequency energy be high, at or near or above the maximum signal level of the channel, the module will actually duck the high frequency portion of the the signal transmitted through the filter below the maximum signal level of the channel to insure that the signal stays within the channel limits defined by the channel window. The foregoing is accomplished since low frequency information (preferably below about 800 Hz) is prevented from being transmitted to the module 120 but instead is transmitted around it through amplifier 136. In particular, only high frequency energy (preferably beginning at about 800 Hz) tends to be transmitted to module 120 due to capacitors 110 and 144. As a result, module 120 impresses a gain on the high frequency portion of the signal above the preferred cutoff frequency of about 800 Hz transmitted to input terminal 118, while simultaneously slightly tilting the spectrum below about 800 Hz. The gain impressed is a function of the control signal provided at control terminal 32 from junction 188 from the detection circuit of FIG. 7. This provides an additional compression of the high frequency portion of the signal preferably at a ratio of up to 2:1 to provide the necessary preemphasis. Since the control signal applied to control terminal 32 is derived from a high frequency region of the information signal transmitted through the encoding system, the amount of high frequency preemphasis is more accurately a function of the high frequency energy present. This compression of the high frequency energy is essentially added to the compression provided by module 24 so that (1) a greater compression occurs in the high frequency region, i.e., 4:1 compression ratio, than in the low frequency region where a compression ratio of 2:1 is provided, and (2) the compression ratio smoothly varies inbetween these frequency regions. In accordance with techniques well known in the art preemphasis has the effect of amplifying (or increasing) the high frequency portion of a program signals having low energy in their high frequency regions, while attenuating or ducking (or decreasing) the high frequency portion of a program signals having high energy in their high frequency regions. This has the effect of boosting low energy high frequency portions of the program signals to bring these portions above the noise floor of the channel, while ducking the high energy high frequency portions signals to bring them below the maximum signal level of the channel. The encoded signal which is compressed and preemphasized is thus provided at output terminal 34 where it can be subsequently transmitted or recorded in the frequency dependent channel such as the one shown in FIG. 1.

It should be appreciated that the output signal at terminal 34 is sensed at terminal 160 of the detection path where the high and low frequency regions are separated by filters 36 and 38. A DC signal equivalent to the instantaneous RMS value on the output of each of the filters 36 and 38 are subsequently provided by the preferred level detectors 40 and 42. The output provided by detector 40 is applied to the junction 188 where it is subsequently provided to control terminal 32 of the encoding system. Similarly, a DC output of detector 42 preferably representative of the instantaneous RMS value of the output of filter 38 is applied to the control terminal 26 of module 24. It should be appreciated that by using a control signal proportional to the amount of high frequency signal energy, maximum use of the dynamic width of the channel may be substantially obtained.

When decoding the encoded signal Ei received from the transmitting or recording channel, the decoding system functions in a complementary manner to that of the encoding system in order to restore the decoded signal to its original form (Ein), prior to encoding. More particularly, the encoded signal Ei upon reception or on playback is applied to the input terminal 10A. The filter 20A will remove any extraneous noise below or above the bandwidth of the program signal before being applied to the input terminal 30A of variable filter 28A. Variable filter 28A deemphasizes the encoded signal in a complementary manner to the preemphasis provided during the encoding process. More particularly, the high frequency portion of the encoded signal is transmitted to the input terminal 228 of the module 230. The high frequency portion of the signal is thus expanded at the complementary ratio as the compression ratio of the module 120. Thus, in the preferred embodiment, the high frequency portion of the signal is essentially expanded at a maximum 1:2 expansion ratio. The amount of gain impressed on this portion of the signal varies in accordance with the control signal applied to the control terminal 32A provided from junction 188 of the level detection path shown in FIG. 7. The capacitors 220 and 260 will prevent the low frequency portions of the signal from being applied to the input terminal 228 of the module 230. This low frequency signal energy is directed through amplifier 244. The output of the filter is applied to the input terminal 22A of module 24A, which in turn expands the entire signal again at a complementary ratio to the compression ratio provided by the original module 24 of the encoding system of FIG. 6. In the preferred embodiment module 24A thus expands the signal at the 1:2 expansion ratio. The gain impressed on the signal over the entire spectrum of the bandwidth of interest is thus a function of the control signal applied to the terminal 26A from junction 206 of FIG. 7. The output of module 24A is applied through the amplifier 268 to the output 34A where the output signal Eo is the restored signal Ein originally applied to input terminal 10 of the encoding system.

It should be appreciated that the particular encoding and decoding systems can be specifically tailored to be used with a particular transmitting or recording channel. Where the system is designed to be used with a cassette tape having the type of frequency response shown in FIG. 1, the various resistors and capacitors referred to in FIGS. 6–8 have the following values as shown in Table I.

TABLE I

| Element | Value |
|---------|-------|
| C100 | 1 uf |
| R102 | 33K |
| C106 | 100 pf |
| R108 | 33K |
| C110 | 10 nf |
| R112 | 2000K |
| C114 | 1 nf |
| R116 | 10K |
| R124 | 142K |
| C126 | 100 pf |
| C128 | 330 pf |
| R130 | 120K |
| R132 | 22K |
| R134 | 200K |
| R138 | 2000K |
| R140 | 10K |
| C142 | 1 nf |
| C144 | 22 uf |
| R146 | 100K |
| R148 | 100K |
| C150 | 3.3 nf |
| R152 | 2.7K |
| C162 | 330 pf |
| C164 | 330 pf |
| R168 | 220K |
| R170 | 18K |
| C172 | 6.8 nf |
| R174 | 2.7K |
| C176 | 6.8 nf |
| R178 | 2.7K |
| R180 | 1K |
| C182 | 0.1 uf |
| R184 | 100K |
| R186 | 50K |
| C190 | 0.1 uf |
| R192 | 8.2K |
| C194 | 10 nf |

TABLE I-continued

Figure 9:
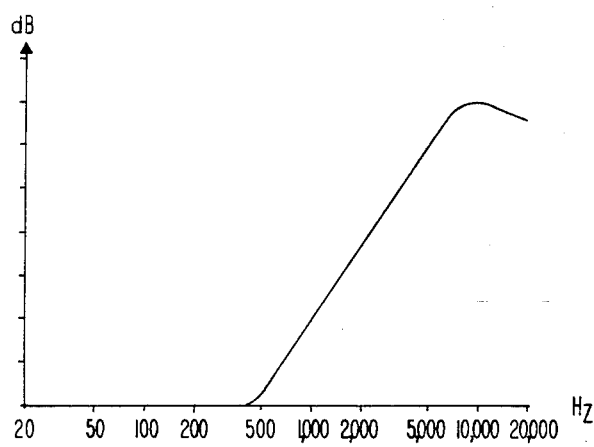
FIG. 9 is a simplified graphical representation of the frequency response in 10 dB/div. of the preferred high frequency level preemphasis filter shown in FIG. 7.
Figure 10:
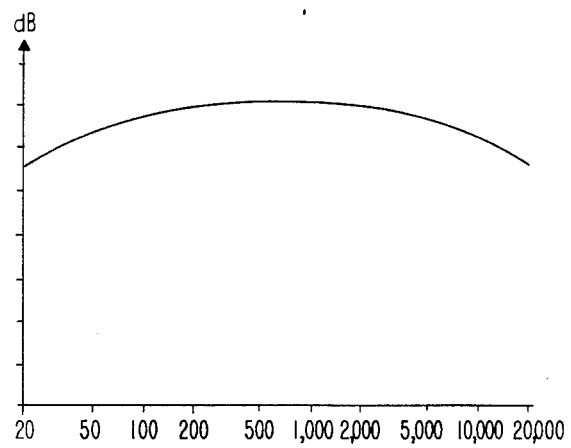
FIG. 10 is a simplified graphical representation of the frequency response in 10 dB/div. of the preferred low frequency level shaping filter shown in FIG. 7.
Figure 11:
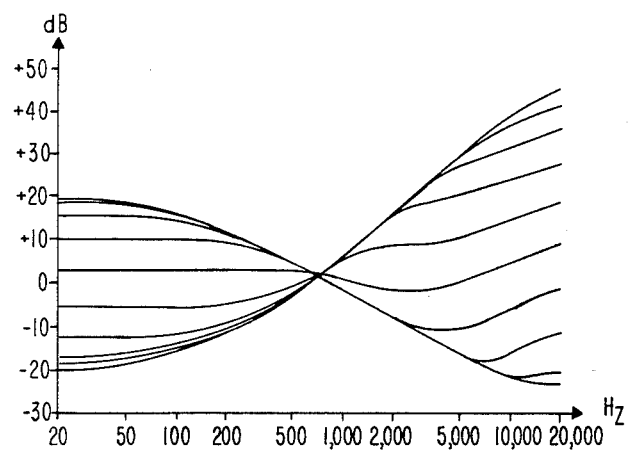
FIG. 11 is a simplified graphical representation of the frequency response of the preferred variable filter used in the encoding system shown in FIG. 4.

| Element | Value |
|---|---|
| R196 | 8.2K |
| R198 | 1K |
| C200 | 0.1 uf |
| R202 | 100K |
| R204 | 50K |
| C220 | 10 nf |
| R222 | 2000K |
| C224 | 1 nf |
| R226 | 10K |
| C234 | 100 pf |
| R236 | 22K |
| R238 | 120K |
| C240 | 330 pf |
| R242 | 142K |
| R246 | 100K |
| R248 | 100K |
| R250 | 2.7K |
| C252 | 3.3 nf |
| R254 | 2000K |
| R256 | 10K |
| C258 | 1 nf |
| C260 | 22 uf |
| R262 | 200K |
| C264 | 1 uf |
| R266 | 33K |
| R270 | 33K |
| C272 | 100 pf | wherein the prefix R and C designate respectively, the resistor and capicitor to which the particular numeral refers to; uf refers to microfarads; nf refers to nanofarads; pf refers to picofarads; and K refers to kilohms. With these particular values the frequency response of high frequency filter 36 for both the encoding system and the decoding system will resemble the response shown in FIG. 9, while the frequency response of low frequency filter 38 for both the encoding and decoding systems will resemble the response shown in FIG. 10. The modules 24 and 24A will not provide any preemphasis or deemphasis. However, the modules 120 and 230 will provide the respective preemphasis and deemphasis in the high frequency band from about 800 Hz to 20 Khz. The preemphasis frequency characteristics of variable filter 28 of the encoding system will provide a slightly variable tilting response up to about 800 Hz as shown in FIG. 11. The maximum boost provided during the encoding process will be at a rate of +12 dB/octave (positive indicating amplification) and a maximum duck or suppression at a rate of about −6 dB/octave (negative indicating attenuation). The deemphasis frequency characteristics of the variable filter 28A will provide the exact complement of that provided by filter 28. Thus, during the decoding process the maximum boost will be at a rate of +6 dB/octave and a maximum duck will be at a rate of −12 dB/octave.

The present invention thus described provides a noise reduction encoding and decoding filter system in which the adaptive signal weighting is accomplished in a manner which is a function of the energy levels in the high frequency portion of the transmitting signal providing a more accurate preemphasis to make better use of the transmitting or recording channel. The control function of the system providing compression or expansion over the entire bandwidth of the signal of interest is derived from the ratio of the energy levels in substantially one portion of the spectrum so as to provide overall bandwidth compression and expansion. The preemphasis of the high frequency portion of the signal provided during encoding is primarily above 800 Hz for recording on audio cassette tape where most of the noise resides.

It should be appreciated that various changes may be made in the encoding and decoding systems shown without departing from the scope of the invention. For example, while the encoding system of FIG. 4 and the portion shown in FIG. 6 is disclosed as having the filter 20, gain control module 24 and variable filter 28 connected in seriatim, it should be appreciated that the connection of the module 24 and filter 28 can be reversed. Similarly, although the decoding system of FIG. 5 and the portion shown in FIG. 8 is disclosed as having the filter 20A, variable filter 28A and gain control module 24A connected in seriatim, the filter 28A and module 24A can be connected in a reverse manner. In this way a single system could be built to selectively encode and decode a signal by providing the same order of connection for the filter and module and providing a selection switch for connecting the inputs of the filters 36 and 38 to (1) the output terminal of the system when encoding the information signal received at the system input terminal and (2) the input terminal of the system when decoding the information signal received at the system input terminal.

Since certain other changes may be made in the present invention without departing from the scope of the invention herein involved, it is intended that all matter contained in the above description or shown in the accompanying drawing, shall be interpreted in as illustrative and not a limiting sense.

What is claimed is:

1. An adaptive signal weighting system: including a signal path for transmitting an electrical information signal of a predetermined bandwidth through said system, said system further comprising:
    filter means disposed in said signal path for varying the gain impressed on the portion of said information signal within a first select spectral region within said predetermined bandwidth by a first variable gain factor, said first variable gain factor varying in response to and as a function of a first control signal;
    means for generating said first control signal only in response to and in accordance with the signal energy of said information signal within a second select spectral region including at least a part of said first select spectral region;
    gain control means disposed in said signal path and coupled to said filter means for varying the signal gain impressed on said information signal substantially throughout said predetermined bandwidth by a second variable gain factor, said second variable gain factor varying in response to and as a function of a second control signal; and
    means for generating said second control signal in response to and as a function of the signal energy of said information signal substantially within a third select spectral region within said predetermined bandwidth.

2. A system according to claim 1, wherein said means for generating said second control signal includes means for detecting the signal energy of said information signal below about 5 KHz.

3. A system according to claim 1, wherein said filter means includes means for varying the first variable gain factor impressed on said portion of said information signal so that said first variable gain factor varies from amplification for signals having relatively high energy within said second select spectral region to attenuation for signals having relatively low energy within said second select spectral region.

4. A system according to claim 1, wherein said filter means includes frequency discrimination means for detecting said portion of said information signal within said first select spectral region and for generating a third signal representative of said portion, and second gain control means coupled to said frequency discrimination means for varying the gain impressed on said third signal in response to and as a function of said first control signal.

5. A system according to claim 4, wherein said frequency discrimination means senses signal energy of said information signal above about 800 Hz.

6. A system according to claim 5, wherein said means for generating said first control signal includes sensor means for sensing the signal energy of said information signal above about 2 KHz and means coupled to said sensor means for generating said first control signal only in response to and in accordance with the signal energy of said information signal above about 2 KHz.

7. A system according to claim 4, wherein said first and second gain control means each comprises a voltage control amplifier.

8. A system according to claim 7, wherein each of said amplifiers is set for signal compression at substantially the same compression ratio.

9. A system according to claim 7, wherein each of said amplifiers is set for signal expansion at substantially the same expansion ratio.

10. A system according to claim 1, wherein said means for generating said first control signal includes first detection means for detecting said signal energy of said information signal within said second spectral region, and said means for generating said second control signal includes second detection means for detecting said signal energy of said information signal within said third select spectral region.

11. A system according to claim 10, wherein said first and second detection means each includes means for generating a D.C. signal as a function of the corresponding signal energy detected.

12. A system according to claim 11, wherein each said means for generating a D.C. signal includes an RMS detector.

13. A system according to claim 1, wherein said filter means includes means for varying the first variable gain factor impressed on said portion of said information signal so that said first variable gain factor varies from attenuation for signals having relatively high energy levels within said second select spectral region to amplification of low energy signals having relatively low energy levels within said second select spectral region.

14. A system according to claim 13, wherein said first variable gain factor varies from a maximum of +12dB/octave to −6dB/octave.

15. An adaptive signal weighting system including a signal path for transmitting an electrical information signal of a predetermined bandwidth through said system, said system further comprising:
    filter means disposed in said signal path for varying the gain impressed on the portion of said information signal within a first select spectral region within said predetermined bandwidth by a first variable gain factor, said first variable gain factor varying in response to and as a function of a first control signal;
    means for generating said first control signal in response to and in accordance with the absolute value of the signal energy of said information signal within a second select spectral region within said predetermined bandwidth including at least a part of said first select spectral region;
    gain control means disposed in said signal path and coupled to said filter means for varying the signal gain impressed on said information signal substantially throughout said predetermined bandwidth by a second variable gain factor, said second variable gain factor varying in response to and as a function of a second control signal; and
    means for generating said second control signal in response to and as a function of the signal energy of said information signal substantially within a third select spectral region within said predetermined bandwidth.

16. A system for encoding an electrical information signal of a predetermined bandwidth so that said information signal can be recorded on or transmitted through a dynamically-limited, frequency dependent channel having a narrower dynamically-limited portion in a first spectral region than in at least one other spectral region of said predetermined bandwidth, said system comprising:
    input means for receiving said information signal;
    a signal transmission path coupled to said input means for transmitting said information signal received at said input means;
    output means coupled to said input means through said signal transmission path for providing said information signal as encoded by said system;
    gain control means coupled to said signal path for varying the signal gain impressed on said information signal substantially throughout said predetermined bandwidth, said signal gain varying in response to and as a function of a first control signal;
    filter means coupled to said signal path and said gain control means for impressing a second variable gain on the portion of said information signal substantially within said first spectral region so as to preemphasize said portion with respect to the remaining portions of said information signal, said second variable gain varying in response to and as a function of a second control signal;
    means for generating said first control signal in response to and as a function of the signal energy of said information signal substantially within a second spectral region of said predetermined bandwidth; and
    means for generating said second control signal only in response to and in accordance with the signal energy of said information signal within a third spectral region of said predetermined bandwidth including at least a part of said first spectral region.

17. A system according to claim 16, wherein said means for generating said second control signal includes means for detecting the signal energy of said information signal below about 5KHz.

18. A system according to claim 16 wherein said filter means includes frequency discrimination means for detecting said portion of said information signal substantially within said first spectral region and for generating a third signal representative of said portion, and second gain control means coupled to said frequency discrimination means for varying the gain impressed on said third signal in response to and as a function of said first control signal.

19. A system according to claim 18, wherein said first and second gain control means each comprises a voltage control amplifier.

20. A system according to claim 19, wherein each of said amplifiers is set for signal compression at substantially the same compression ratio.

21. A system according to claim 20, wherein said compression ratio is 2:1.

22. A system according to claim 16, wherein said means for generating said first control signal includes first detection means for detecting said signal energy of said information signal within said second spectral region and said means for generating said second control signal includes second detection means for detecting said signal energy of said information signal within said third spectral region.

23. A system according to claim 22, wherein said first and second detection means each includes means for generating a D.C. signal as a function of the corresponding signal energy detected.

24. A system according to claim 23, wherein each said means for generating a D.C. signal includes an RMS detector.

25. A system according to claim 16, wherein said filter means includes means for varying the gain impressed on said portion of said information signal so that said gain varies from attenuation for signals having relatively high energy levels in said third spectral region to amplification of signals having relatively low energy levels in said third spectral region.

26. A system according to claim 25, wherein said gain impressed on said portion of said information signal varies from a maximum of +12dB/octave to −6dB/octave.

27. A system for encoding an electrical information signal of a predetermined bandwidth so that said encoded signal can be recorded on or transmitted through a dynamically-limited, frequency dependent channel having a narrower dynamically-limited portion in one spectral region than in at least one other spectral region, said system comprising:
input means for receiving said information signal;
output means coupled to said input means through a signal transmission path for providing said encoded signal;
gain control means disposed in said signal path for varying the signal gain impressed on said information signal substantially throughout said predetermined bandwidth, said signal gain varying in response to and as a function of a first control signal; coupled to said
filter means disposed in said signal path and gain control means for impressing a second variable gain on the portion of said information signal substantially within said one spectral region so as to preemphasize said portion with respect to the remaining portions of said information signal, said second variable gain varying in response to and as a function of a second control signal;
means for generating said first control signal in response to and as a function of the signal energy of said encoded signal substantially within a second spectral region; and
means for generating said second control signal in response to and in accordance with the absolute value of the signal energy of said encoded signal within a third spectral region of said predetermined bandwidth including at least a part of said one spectral region.

28. A system for decoding an electrical information signal of a predetermined bandwidth previously encoded so that said information signal can be recorded on or transmitted through a dynamically-limited, frequency dependent channel having a dynamically-limited narrower portion in a first spectral region than in at least one other spectral region of said predetermined bandwidth, said system comprising:
input means for receiving said information signal in its encoded form;
a signal transmission path coupled to said input means for transmitting said information signal;
output means coupled to said signal transmission path for providing said information signal in decoded form;
gain control means disposed in said signal path for varying the signal gain impressed on said information signal substantially throughout said predetermined bandwidth, said signal gain varying in response to and as a function of a first control signal;
filter means disposed in said signal path and coupled to said gain control means for impressing a second variable gain on the portion of said information signal substantially within said first spectral region so as to deemphasize said portion with respect to the remaining portions of said information signal, said second variable gain varying in response to and as a function of a second control signal;
means for generating said first control signal in response to and as a function of the signal energy of said information signal within a second spectral region of said information signal; and
means for generating said second control signal only in response to and in accordance with the signal energy of said information signal substantially within a third spectral region of said predetermined bandwidth including at least a part of said first spectral region.

29. A system according to claim 28, wherein said means for generating said second control signal includes means for detecting the signal energy of said information signal below about 5 KHz.

30. A system according to claim 28, wherein said filter means includes frequency discrimination means for detecting said portion of said information signal substantially within said first spectral region and for generating a third signal representative of said portion, and second gain control means coupled to said frequency discrimination means for varying the gain impressed on said third signal in response to and as a function of said first control signal.

31. A system according to claim 30, wherein said first and second gain control means each comprises a voltage control amplifier.

32. A system according to claim 31, wherein each of said amplifiers is set for signal expansion at substantially the same expansion ratio.

33. A system according to claim 32, wherein said expansion ratio is 1:2.

34. A system according to claim 28, wherein said means for generating said first control signal includes first detection means for detecting said signal energy of said information signal within said second spectral region and said means for generating said second control signal includes second detection means for detecting said signal energy of said information signal within said third spectral region.

35. A system according to claim 34, wherein said first and second detection means each includes means for generating a D.C. signal as a function of the corresponding signal energy detected.

36. A system according to claim 35, wherein each said means for generating a D.C. signal includes an RMS detector.

37. A system according to claim 28, wherein said filter means includes means for varying the gain impressed on said portion of said information signal so that said gain varies from attenuation for information signals having relatively low energy levels in said at least a part of said third spectral region to amplification of information signals having relatively high energy levels in said third spectral region.

38. A system according to claim 37, wherein said gain impressed on said portion of said information signal varies from a maximum of +6dB/octave to −12dB/octave.

39. A system for decoding an electrical information signal of a predetermined bandwidth previously encoded so that said information signal can be recorded on or transmitted through a dynamically-limited, frequency dependent channel having a dynamically-limited narrower portion in one spectral region than in at least one other spectral region, said system comprising:

input means for receiving said previously encoded information signal;

output means coupled to said input means through a signal transmission path for providing said information signal in decoded form;

gain control means disposed in said signal path for varying the signal gain impressed on said encoded information signal substantially throughout said predetermined bandwidth, said signal gain varying in response to and as a function of a first control signal;

filter means disposed in said signal path and coupled to said gain control means for impressing a second variable gain on the portion of said encoded information signal substantially within said one spectral region so as to deemphasize said portion with respect to the remaining portions of said encoded information signal, said second variable gain varying in response to and as a function of a second control signal;

means for generating said first control signal in response to and as a function of the signal energy of said encoded information signal substantially within a second spectral region of said encoded information signal; and means for generating said second control signal only in response to and in accordance with the absolute value of the signal energy of said encoded information signal substantially within a third spectral region of said predetermined bandwidth including at least a part of said one other spectral region.

* * * * *

UNITED STATES PATENT AND TRADEMARK OFFICE
CERTIFICATE OF CORRECTION

PATENT NO. : 4,539,526
DATED : September 3, 1985
INVENTOR(S) : Mark F. Davis

It is certified that error appears in the above-identified patent and that said Letters Patent is hereby corrected as shown below:

Claim 27, column 19, line 53, delete "coupled to said"; and

Claim 27, column 19, line 54, after "and" insert -- coupled to said --.

Signed and Sealed this

Third Day of June 1986

[SEAL]

Attest:

DONALD J. QUIGG

Attesting Officer

Commissioner of Patents and Trademarks